United States Patent
Inoue et al.

(10) Patent No.: US 7,071,635 B2
(45) Date of Patent: Jul. 4, 2006

(54) PLANAR DISPLAY APPARATUS

(75) Inventors: Masutaka Inoue, Neyagawa (JP); Haruhiko Murata, Ibaraki (JP); Yukio Mori, Hirakata (JP); Atsuhiro Yamashita, Osaka (JP); Shigeo Kinoshita, Mizuho (JP)

(73) Assignee: Sanyo Electric Co., Ltd., Moriguichi (JP)

( * ) Notice: Subject to any disclaimer, the term of this patent is extended or adjusted under 35 U.S.C. 154(b) by 0 days.

(21) Appl. No.: 10/483,419

(22) PCT Filed: Sep. 26, 2002

(86) PCT No.: PCT/JP02/09922

§ 371 (c)(1),
(2), (4) Date: Jan. 21, 2004

(87) PCT Pub. No.: WO03/027999

PCT Pub. Date: Apr. 3, 2003

(65) Prior Publication Data
US 2004/0183483 A1 Sep. 23, 2004

(30) Foreign Application Priority Data
Sep. 26, 2001 (JP) ............................. 2001-295157

(51) Int. Cl.
*G09G 3/10* (2006.01)
(52) U.S. Cl. .................................... 315/366; 315/169.3
(58) Field of Classification Search ............. 315/169.1, 315/169.3, 366, 169; 345/76
See application file for complete search history.

(56) References Cited

U.S. PATENT DOCUMENTS

| 4,686,426 A | 8/1987 | Fujioka et al. |
| 4,983,885 A | 1/1991 | Fujioka et al. |
| 5,399,936 A * | 3/1995 | Namiki et al. ............... 313/504 |
| 5,672,937 A * | 9/1997 | Choi et al. ................... 313/503 |
| 5,734,361 A | 3/1998 | Suzuki et al. |
| 5,760,858 A * | 6/1998 | Hodson et al. ................ 349/61 |
| 5,886,474 A * | 3/1999 | Asai et al. ................ 315/169.1 |
| 6,148,075 A * | 11/2000 | Inubushi et al. ............ 379/368 |
| 6,177,767 B1 * | 1/2001 | Asai et al. ................ 315/169.1 |
| 6,703,146 B1 * | 3/2004 | Sakaguchi et al. .......... 428/690 |
| 2003/0197664 A1 * | 10/2003 | Koyama ...................... 345/76 |

FOREIGN PATENT DOCUMENTS

| EP | 0 434 033 A2 | 6/1991 |
| JP | 61-83596 | 4/1986 |
| JP | 3-189621 | 8/1991 |
| JP | 7-295509 | 11/1995 |
| JP | 8-248920 | 9/1996 |
| JP | 9-115673 | 5/1997 |
| JP | 10-112391 | 4/1998 |
| JP | 11-338413 | 12/1999 |
| JP | 2000-242208 | 9/2000 |
| JP | 2001-109398 | 4/2001 |

* cited by examiner

*Primary Examiner*—Don Wong
*Assistant Examiner*—Hung Tran Vy
(74) *Attorney, Agent, or Firm*—Armstrong, Kratz, Quintos, Hanson & Brooks, LLP

(57) ABSTRACT

The invention provides a flat display device which comprises for pixels arranged along drive lines a voltage drop calculator 27 for calculating a voltage drop occurring in accordance with the position of each pixel, and a video signal converter 30 and a lookup table 31 for correcting the input signal to be supplied to the pixel in accordance with the magnitude of the calculated voltage drop, whereby crosstalk due to the voltage drop is prevented.

8 Claims, 8 Drawing Sheets

PLANAR DISPLAY APPARATUS

This application is a 371 of PCT/JP02/09922.

BACKGROUND OF THE INVENTION

1. Field of the Invention

The present invention relates to flat display devices, such as organic electroluminescence display devices and inorganic electroluminescence display devices.

2. Description of the Related Art

Progress has been made in recent years in developing flat displays of the self-luminescence type such as organic electroluminescence displays (hereinafter referred to as "organic EL displays") and inorganic electroluminescence displays (hereinafter referred to as "inorganic EL displays"). Use of organic EL displays, for example, in portable telephones is under study.

FIGS. 6 and 7 show an organic EL display, which is fabricated by forming an organic hole transport layer 15 and an organic electron transport layer 16 on opposite sides of an organic luminescent layer 14 to provide an organic layer 13 on a glass substrate 11 serving as a base, and forming anodes 12 and cathodes 17 on opposite sides of the organic layer 13. The organic luminescent layer 14 is caused to luminesce by applying a predetermined voltage across the anode 12 and the cathode 17.

The anodes 12 are made from transparent ITO (indium tin oxide), and the cathodes 17, for example, from an Al—Li alloy. The electrodes of each type are prepared in the form of stripes to intersect those of the other type in the form of a matrix. The anodes 12 are used as data electrodes, and the cathodes 17 as scanning electrodes. With one of horizontally extending scanning electrodes selected, voltage in accordance with input data is applied to data electrodes extending perpendicular to the scanning electrode, whereby the organic layer 13 is caused to luminesce at the intersections of the scanning electrode and the data electrodes to give a display of one line. The scanning electrodes are changed over one after another in the perpendicular direction to scan the matrix in the perpendicular direction to give a display of one frame.

The methods of driving such organic EL displays include the passive matrix driving method wherein the scanning electrodes and the data electrodes are used for time division driving, and the active matrix driving method wherein each pixel is held luminescent for one vertical scanning period.

On the other hand, FIGS. 10 and 11 show an inorganic EL display, which comprises a substrate 110 of glass or ceramic serving as a base, an inorganic layer 130 composed of an inorganic luminescent layer 140 and a dielectric layer 150 formed on one side of the layer 140, and first electrodes 120 and second electrodes 170 which are arranged respectively on opposite sides of the inorganic layer 130. AC voltage is applied across the first electrode 120 and the second electrode 170 to cause the inorganic luminescent layer 140 to luminesce.

It is known that like organic EL displays of the passive matrix driving type, the inorganic EL display is adapted for time division driving using scanning electrodes and data electrodes. While the organic EL display is driven with direct current for passing current through the luminescent layer thereof, the inorganic EL display is driven with alternating current for passing current through the luminescent layer thereof.

In the organic EL display of the active matrix driving type, each organic EL element 20 providing one pixel 10 has a first transistor TR1 performing an on/off function, a second transistor TR2 for converting input data to a current value, and a capacitance element C performing a memory function as shown in FIG. 8. A drive line 4 is connected to the source of the second transistor TR2. A drive circuit 6 comprises a gate driver 61 for driving the scanning electrodes, and a source driver 62 for driving the data electrodes.

First, the gate driver 61 successively applies voltage to the scanning electrodes to bring the first transistors TR1 connected to the same scanning electrode into conduction. Data (input signal) is fed to the source driver 62 as timed with this scanning. Since the first transistor TR1 is in a conducting state at this time, the data is stored in the capacitance element C.

The operating state of the second transistor TR2 is dependent on the charge of data stored in the capacitance element C. For example, suppose the second transistor TR2 is brought into an operative state. Current is then supplied to the organic EL element 20 via the second transistor TR2. As a result, the EL element 20 luminesces. This luminescent state is maintained over one vertical scanning period.

The organic EL display 1 is self-luminescent, as stated above, and the required pixels only need to be turned on, so that the display is adapted to reduce power consumption unlike the liquid crystal display wherein the backlight needs to be on at all times. This is also true with all flat displays of the self-luminescent type including inorganic EL displays.

For example, when white is displayed in a central area B of the screen of the organic EL display 1 shown in FIG. 9, with a given intermediate color presented in the area surrounding this area B, the upper and lower areas A and A' of drive lines (power supply lines) indicated in broken lines have luminance lower than the luminance corresponding to the input signal, unlike the left and right areas showing the intermediate color, hence the problem of so-called crosstalk. Although the central area B has luminance lower than the luminance corresponding to the input signal, the lower luminance is not conspicuous because there is nothing to be compared with the area.

Accordingly, an object of the present invention is to provide a flat display device in which crosstalk is suppressed.

SUMMARY OF THE INVENTION

The present applicant has clarified the cause for the above-mentioned crosstalk in flat display devices of the self-luminescent type. Although the cause involved in the organic EL display of the active matrix driving type will be described below, the cause for crosstalk will be similarly determined in organic EL displays and inorganic EL displays of the passive matrix driving type.

In the case where white is to be displayed in the area B within the screen of an organic EL display as shown in FIG. 9, a large input voltage is applied to the gates of second transistors arranged in the area B, and a large current is caused to correspondingly flow between the sources and drains of the second transistors from the drive lines 4.

The current supplied from a current source connected to one end of the drive line 4 dividedly flows into the second transistors TR2 of pixels 10 and is supplied to the transistors TR2 while flowing through the drive line 4 in one direction, so that the current value at the points of division is greatest at the division point in the most upstream position and smallest at the division point in the most downstream position. The current flowing through the drive line 4 is further influenced by electric resistance corresponding to the length of the drive line 4, and the electric resistance gives rise to a voltage drop.

Because the drive line needs to be supplied with current corresponding to the amount of luminescence to be produced as described above, the organic EL display has connected thereto a power source circuit or driver circuit for supplying current to the drive line. The power source circuit or driver circuit also involves output resistance, so that not only the voltage drop due to the resistance of the drive line but also a voltage drop due to the output resistance of the power source circuit or driver circuit occurs in accordance with the amount of luminescence.

In the example shown in FIG. 9, therefore, the voltage drop involved in each pixel is greatest in the area A, while the combined voltage drop is greatest in area A'. The term "combined voltage drop" means a voltage drop ΔV represented by Mathematical Expression 1 given later. In other words, the current supplied to the second transistor is smaller in the upstream area A and downstream area A' than in the area B, consequently failing to afford luminance corresponding to the input signal and generating crosstalk. A voltage drop occurs also in the area B, whereas becuase no adjacent image to be compared is present, a reduction in luminance does not appear obvious.

The present invention provides a flat display device wherein each of pixels comprises a luminescent layer and two electrodes arranged, respectively, on opposite sides of the luminescent layer, and a drive signal is supplied to each pixel from a drive circuit through a drive line to thereby apply a voltage in accordance with an input signal across the two electrodes and cause the luminescent layer to luminesce, wherein display device comprises input signal correcting means for correcting the input signal in accordance with the magnitude of a voltage drop occurring in the drive signal to be supplied to the pixel. The luminescent layer is made from an organic material or inorganic material.

Stated specifically, the present invention provides a flat display device wherein a pair of electrodes are arranged, respectively, on opposite sides of a luminescent layer, and a voltage in accordance with an input signal is applied across the electrodes by a drive signal supplied through a drive line for each of pixels provided by the luminescent layer to cause the luminescent layer to luminesce, wherein the display device comprises:

means provided for the drive line for calculating a voltage drop occurring in the drive line in accordance with the position of the pixel, based on the input signal to be supplied to the pixel, and means for correcting the input signal to be supplied to the pixel based on the magnitude of the calculated voltage drop.

With the flat display device of the invention described, the voltage drop occurring in the drive line in accordance with the position of each pixel is calculated, and the input signal to be supplied to the pixel is corrected based on the magnitude of the calculated voltage drop, so that the pixel is to luminesce with luminance according to the input signal.

When the display device is an organic EL display device of the active matrix driving type, the cathode is in the form of a sheet, and the anode is in the form of stripes. The pixels provided by an organic layer each have a first transistor TR1 to be brought into or out of conduction with the voltage of the cathode, a capacitance element C for storing a signal to be input from the anode by the first transistor conducting, and a second transistor TR2 for producing drive current in accordance with the input signal with a drive signal (electric power) to be supplied from the drive line.

Stated specifically, the voltage drop calculating means calculates the voltage drop based on the magnitude of current flowing through the pixel in accordance with the input signal and on a resistance value depending on the position of the pixel.

Further stated specifically, the voltage drop calculating means has a coefficient depending on the material characteristics of each of RGB pixels and calculates the magnitude of current flowing through the pixel in accordance with the coefficient and the input signal to the pixel.

Further stated specifically, the input signal correcting means comprises first conversion means for converting the magnitude of the calculated voltage drop to a reduction in the current flowing through the pixel, and second conversion means for converting the current reduction obtained from the first conversion means to an amount of correction of the input signal to be supplied to the pixel.

Further stated specifically, the drive line is in the form of stripes extending in the same direction as the direction of scanning of display images.

With the flat display device of the present invention, each of pixels luminesces with luminance in accordance with the input signal despite a voltage drop occurring in the drive line. No crosstalk therefore occurs due to the voltage drop.

DETAILED DESCRIPTION OF THE EXEMPLARY EMBODIMENTS

Figure 1:
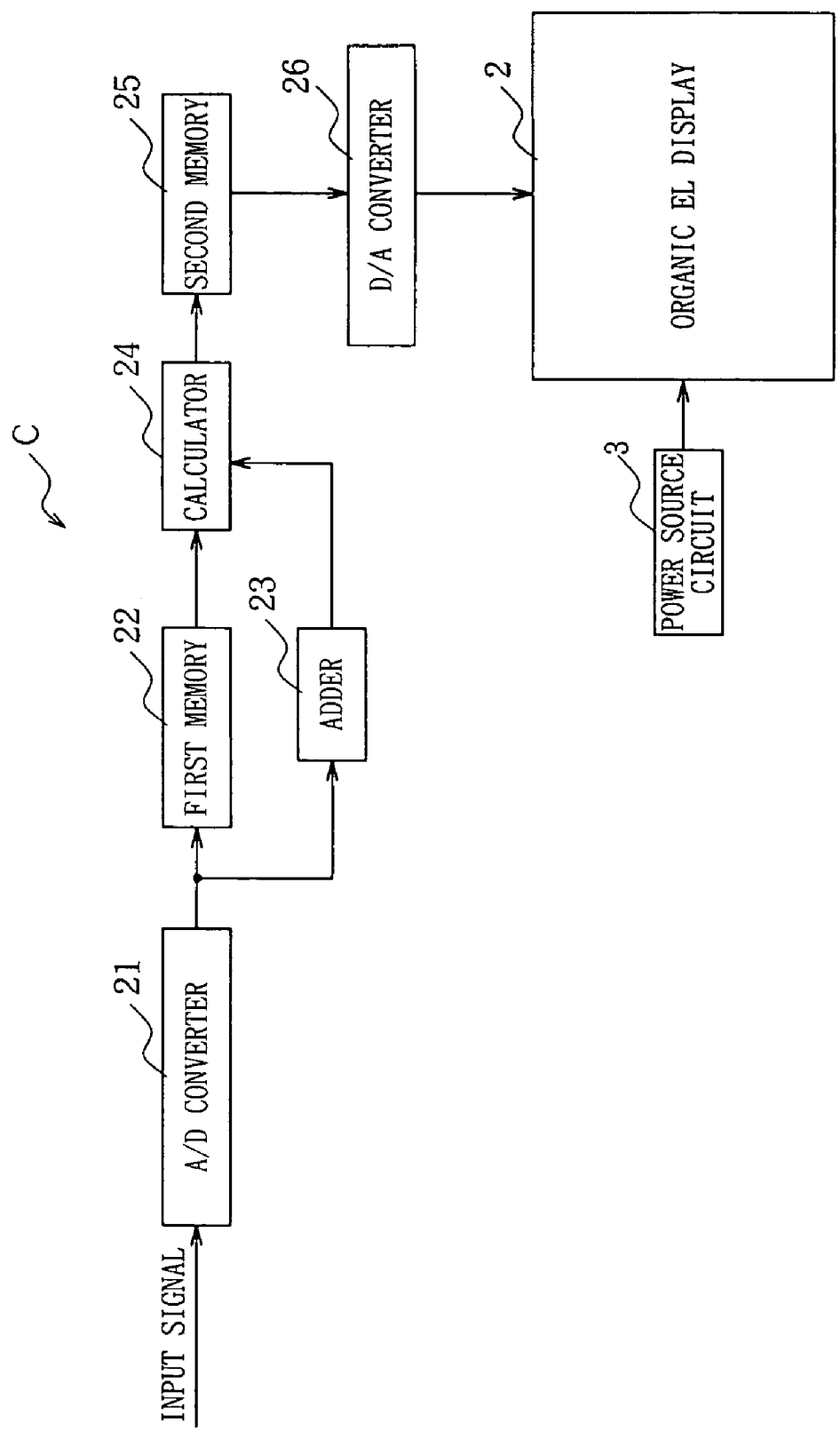
FIG. 1 is a block diagram showing the construction of an organic EL display device according to the invention.

With reference to the drawings, a detailed description will be given of the invention as embodied into an organic EL display of the active matrix driving type. FIG. 1 shows an organic EL display device according to the invention which comprises an organic EL display 2 of the active matrix driving type, and a power source circuit 3 for supplying driving electric power to the display 2. The input signal to be given to the display 2 is fed to a correction circuit C shown in FIG. 1, thereby processed for correction as will be described below and thereafter supplied to the display 2.

Figure 3:
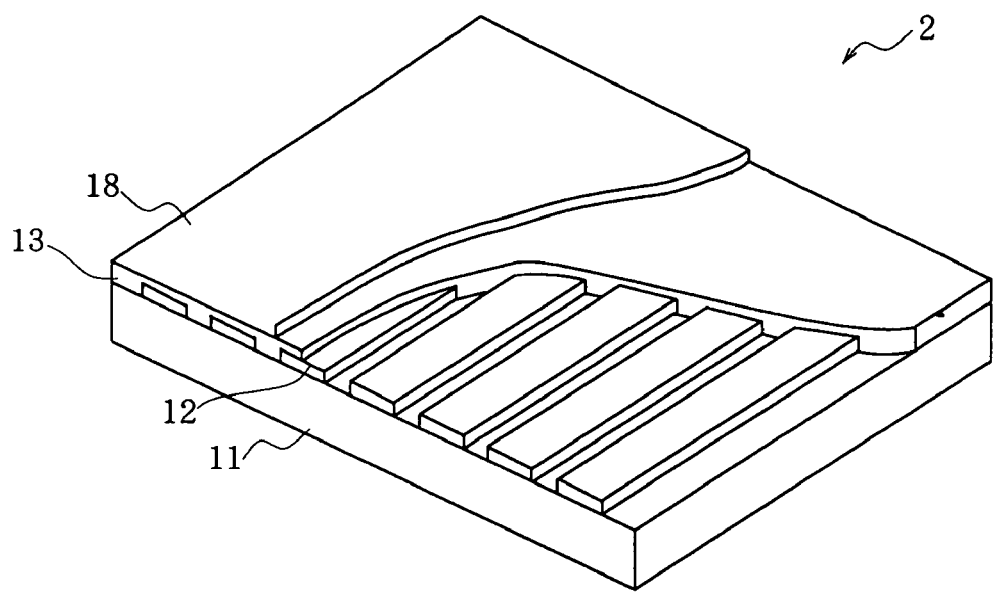
FIG. 3 is a perspective view partly broken away and showing an organic EL display of the active matrix driving type for use in the invention.
Figure 4:
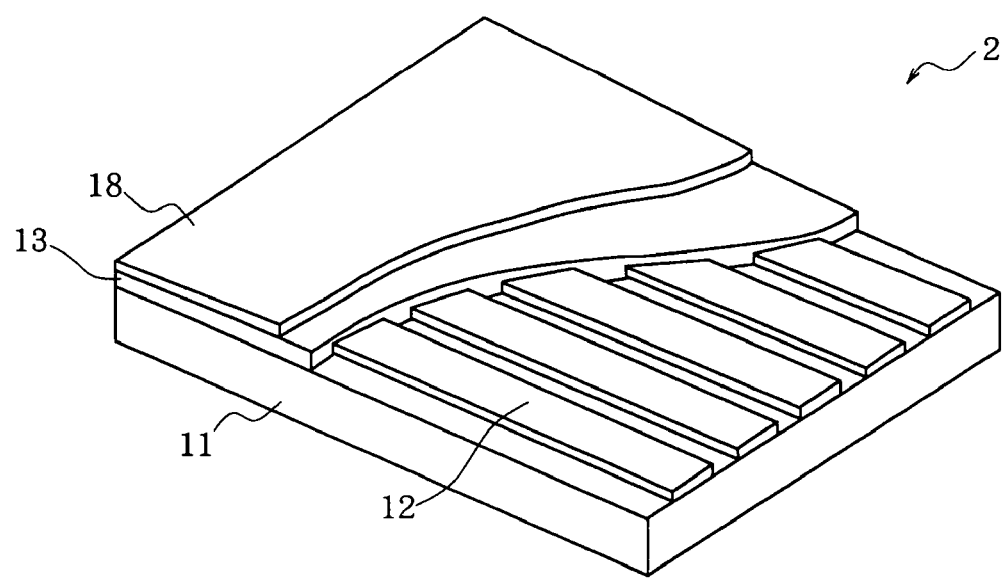
FIG. 4 is a perspective view partly broken away and showing another organic EL display of the active matrix driving type for use in the invention.

Usable in the organic EL display 2 are an anode 12 in the form of stripes extending vertically of the screen as shown in FIG. 3, and a cathode 18 in the form of a sheet. Alternatively usable are an anode 12 in the form of stripes extending horizontally of the screen as shown in FIG. 4, and a cathode 18 in the form of a sheet. The present embodiment comprises an organic EL display 2 of the type shown in FIG. 4.

In the correction circuit C shown in FIG. 1, the input signal is first converted to digital data in an A/D converter 21, and thereafter fed to a first memory 22 and an adder 23. The input data is temporarily stored in (written to) the first memory 22, and upon lapse of one scanning period 1H, the data is output to (read by) a calculator 24 subsequently provided. The data is read and written at the same time for a delay of 1H. The adder 23 adds up the input data in an amount corresponding only to 1H, and delivers the sum to the subsequent calculator 24.

The calculator 24 performs the calculation to be described below based on the data input from the first memory 22 and the sum value input from the adder 23, whereby the input data is corrected in accordance with the magnitude of a voltage drop of the aforementioned drive line. The corrected data is temporarily stored in a second memory 25. The data is thereafter read from the second memory 25, converted to an analog signal in a D/A converter 26 and thereafter supplied to the organic EL display 2.

Figure 5:
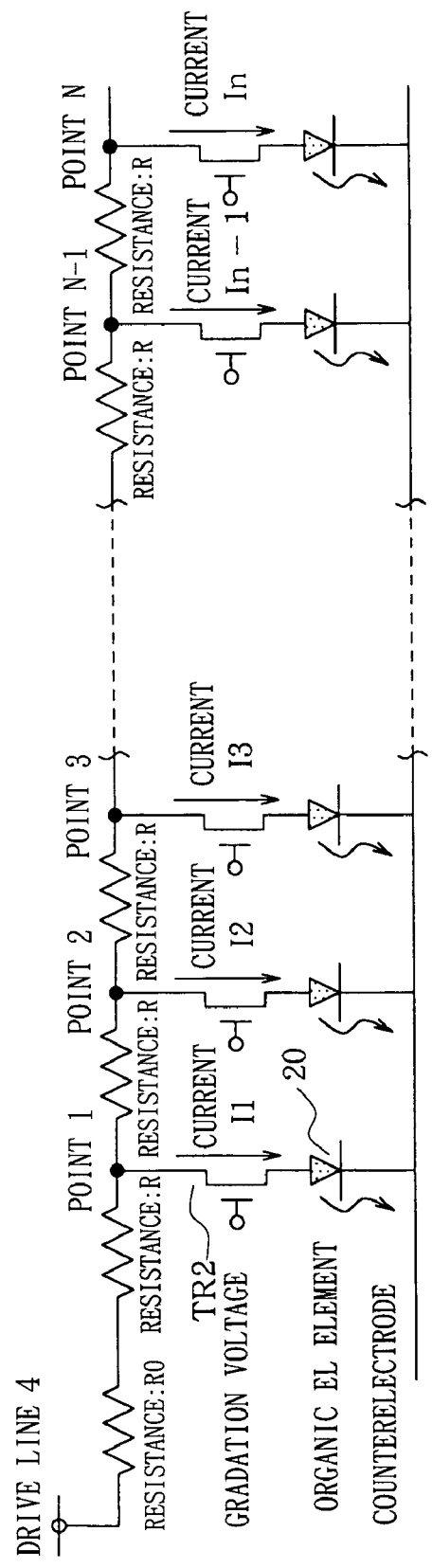
FIG. 5 is an equivalent circuit diagram of a drive system for pixels.
Figure 6:
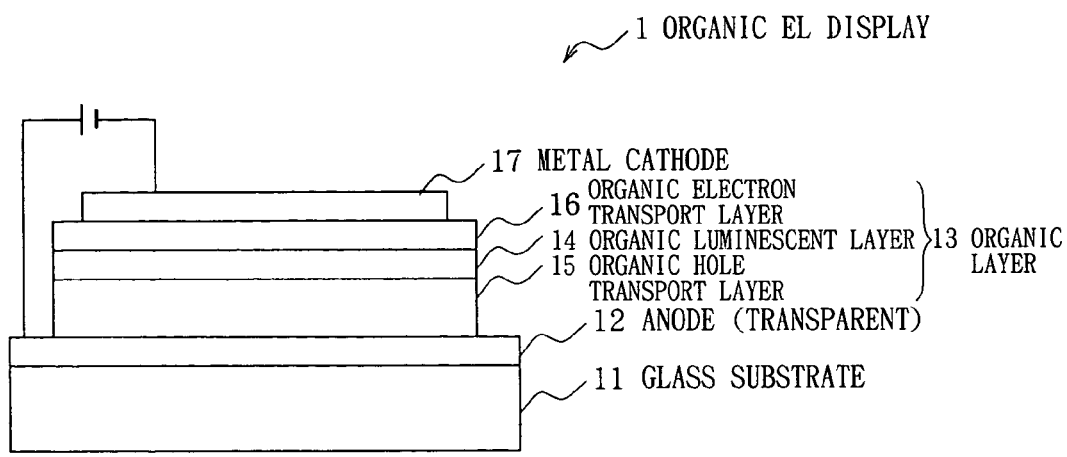
FIG. 6 is a diagram showing the layered structure of an organic EL display of the passive matrix driving type.
Figure 7:
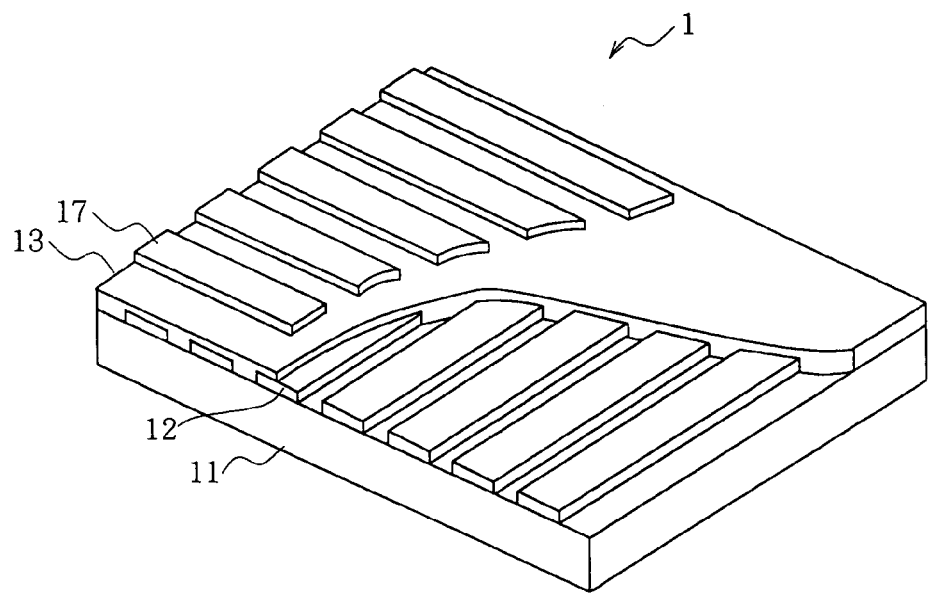
FIG. 7 is a perspective view partly broken away and showing the organic EL display of the passive matrix driving type.
Figure 8:
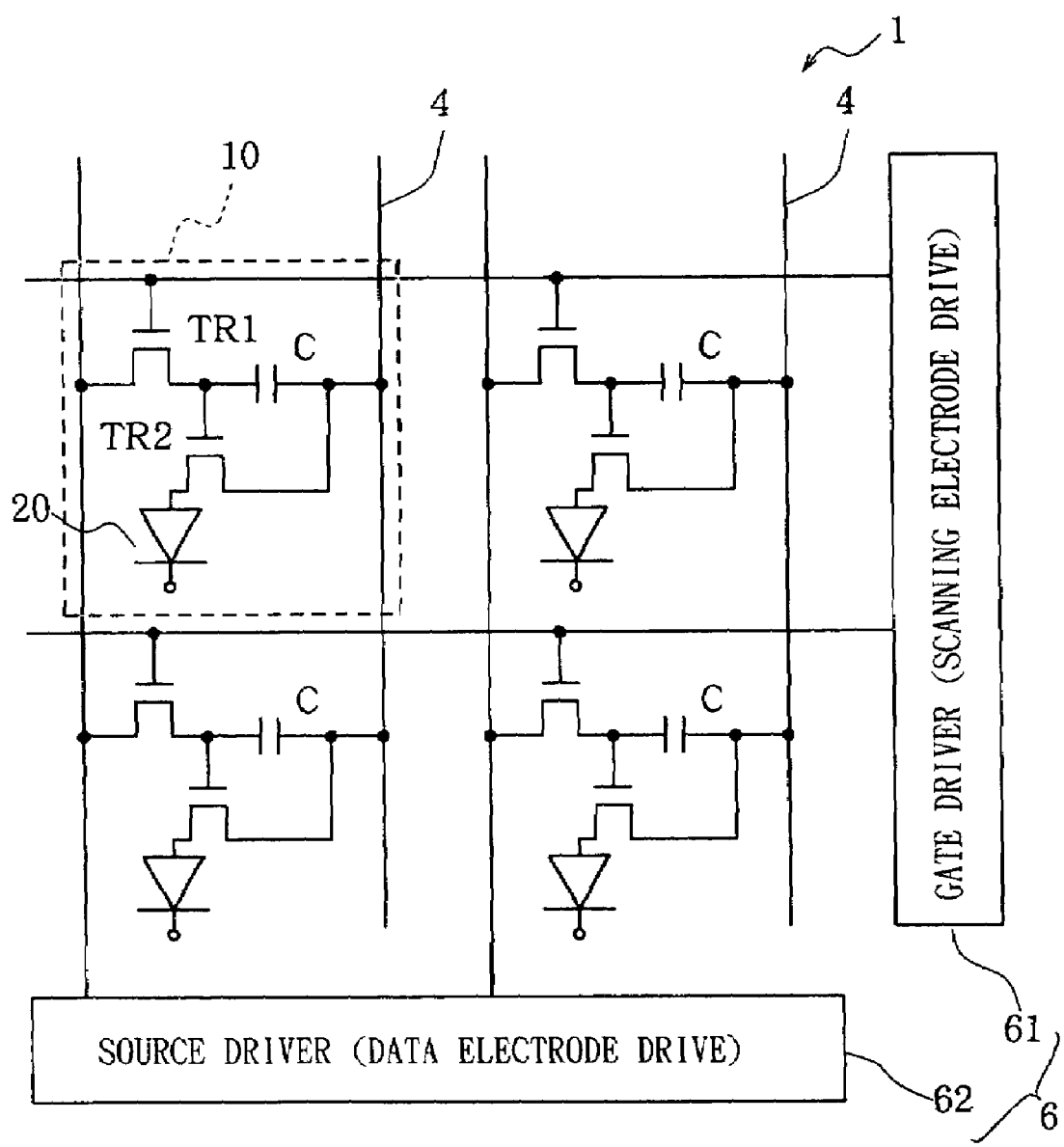
FIG. 8 is an equivalent circuit diagram of an organic EL display of the active matrix driving type.
Figure 9:
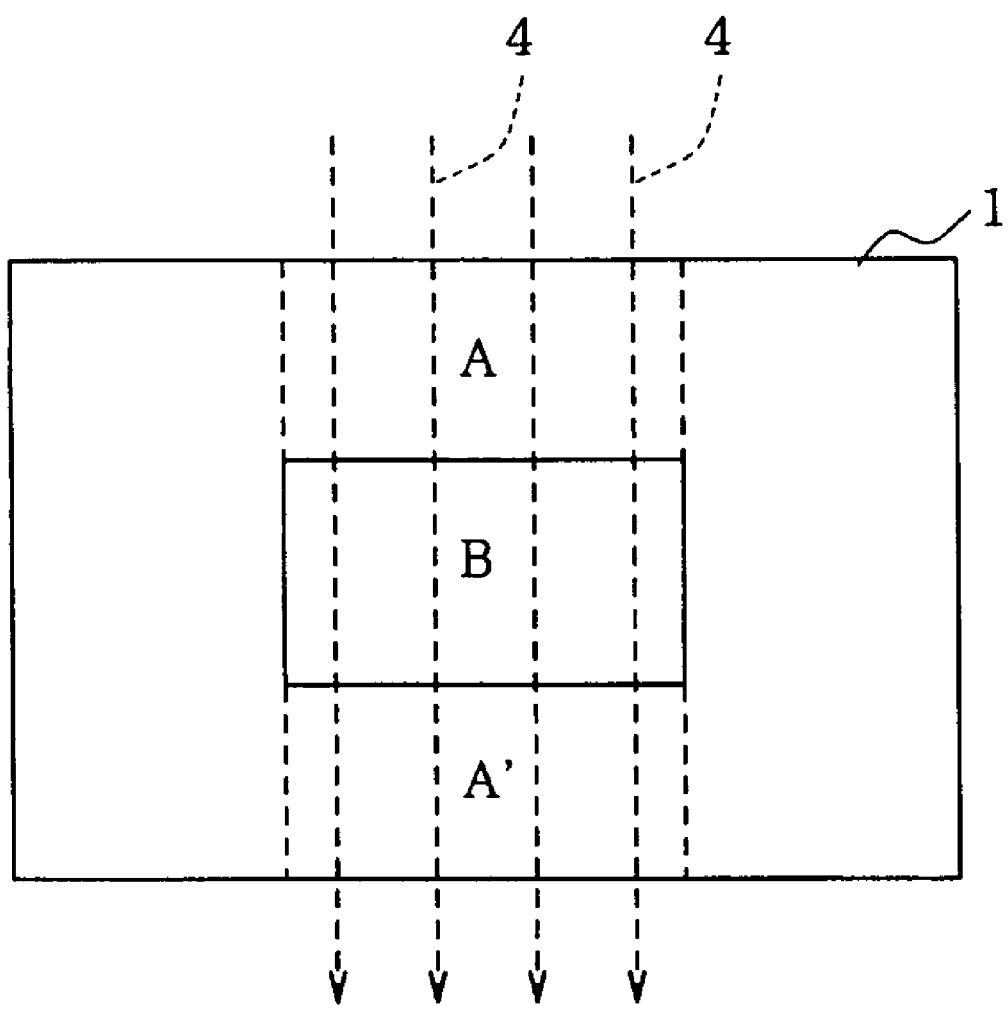
FIG. 9 is a diagram for illustrating the problem of the organic EL display of the active matrix driving type.
Figure 10:
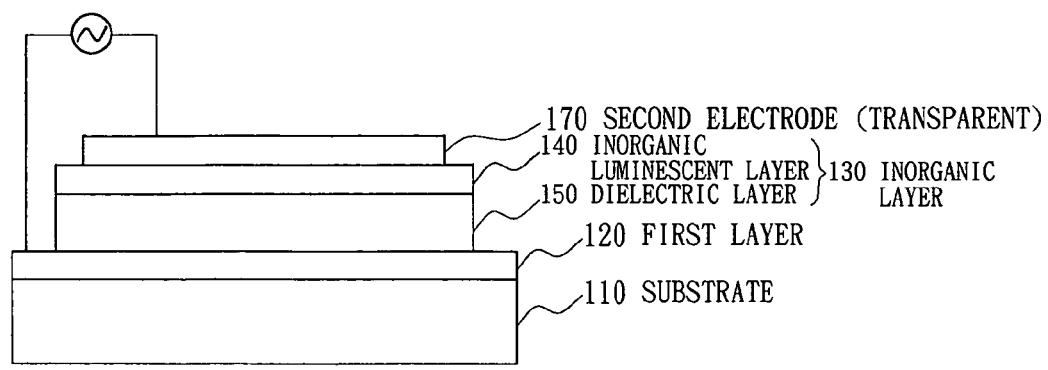
FIG. 10 is a diagram showing the layered structure of an inorganic EL display of the passive matrix driving type.
Figure 11:
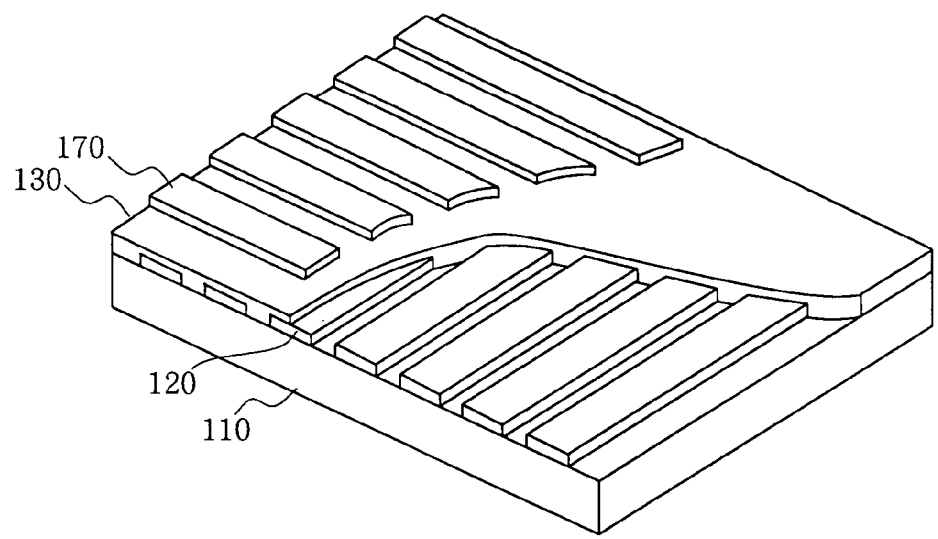
FIG. 11 is a perspective view partly broken away and showing the inorganic EL display of the passive matrix driving type.

The principle of correction of data by the calculator 24 will now be described with reference to FIG. 5. Referring to FIG. 5, second transistors TR2 and organic EL elements 20 are connected in parallel to a drive line 4 extending horizontally for supplying electric power, the transistors, as well as the EL elements, being equal in number to the number n of pixels on one horizontal scanning line. A gradation voltage in accordance with the input data is applied to the gate of each second transistor TR2, and the current to be supplied to the organic EL element 20 from the drive line 4 via the second transistor TR2 is controlled according to the voltage.

Now suppose the points at each of which the drive line 4 branches off toward the second transistor are point 1 to point N as arranged downstream from the upstream side as illustrated, the resistance of the line from a point (contact portion) where the drive line 4 is connected to a current source (not shown) to the point 1 is R0, the electric resistance of each pixel to the current flowing therethrough is R, and the current flowing through the respective pixels are I1 to In. The voltage drops $\Delta V1$ to $\Delta Vn$ at the respective points are expressed by Mathematical Expressions 1 given below.

(Mathematical Expressions 1)

$$\Delta V1 = (I1 + I2 + I3 + \ldots I_{n-1} + In) \times R0 +$$
$$\underline{(I1 + I2 + I3 + \ldots I_{n-1} + In) \times R}$$
$$\Delta V2 = (I1 + I2 + I3 + \ldots I_{n-1} + In) \times R0 +$$
$$(I1 + I2 + I3 + \ldots I_{n-1} + In) \times R +$$
$$\underline{I2 + I3 + \ldots I_{n-1} + In) \times R}$$
$$\Delta V3 = (I1 + I2 + I3 + \ldots I_{n-1} + In) \times R0 +$$
$$(I1 + I2 + I3 + \ldots I_{n-1} + In) \times R +$$
$$(I2 + I3 + \ldots I_{n-1} + In) \times R +$$
$$\underline{(I3 + \ldots I_{n-1} + In) \times R}$$

-continued $$\vdots$$
$$\Delta V_{n-1} = (I1 + I2 + I3 + \ldots I_{n-1} + In) \times R0 +$$
$$(I1 + I2 + I3 + \ldots I_{n-1} + In) \times R +$$
$$(I2 + I3 + \ldots I_{n-1} + In) \times R +$$
$$(I3 + \ldots I_{n-1} + In) \times R$$
$$\vdots$$
$$+\underline{(I_{n-1} + In) \times R}$$
$$\Delta V_n = (I1 + I2 + I3 + \ldots I_{n-1} + In) \times R0 +$$
$$(I1 + I2 + I3 + \ldots I_{n-1} + In) \times R +$$
$$(I2 + I3 + \ldots I_{n-1} + In) \times R +$$
$$(I3 + \ldots I_{n-1} + In) \times R$$
$$\vdots$$
$$+(I_{n-1} + In) \times R +$$
$$\underline{In \times R}$$

With reference to Mathematical Expressions 1 given above, the underlined term included in the voltage drop expression at a particular point is a term added to the expression of the voltage drop at the point immediately preceding the particular point. By adding a voltage corresponding to the voltage drop of Mathematical Expression 1 to the gradation voltage to be applied to the gate of the second transistor TR2 concerned, the desired current value, namely, luminescence of desired luminance, is available free of the influence of the voltage drop.

Suppose the voltage drop due to the resistance R0 is A, and the sum of the currents I1 to In flowing through the pixels is I. Expressions 1 can then be rewritten as Mathematical Expressions 2 given below by replacing the voltage drop expression at each point with a voltage drop expression at the immediately preceding point.

(Mathematical Expressions 2)

$$\Delta V1 = A + I \times R$$

$$\Delta V2 = \Delta V1 + (\text{current value at point } 1 - I1) \times R$$

$$\Delta V3 = \Delta V2 + (\text{current value at point } 2 - I2) \times R$$

$$\cdot$$
$$\cdot$$

$$\Delta V_{n-1} = \Delta V_{n-2} + (\text{current value at point } n\text{-}2 - I_{n-2}) \times R$$

$$\Delta V_n = \Delta V_{n-1} + (\text{current value at point } n\text{-}1 - I_{n-1}) \times R$$

Figure 2:
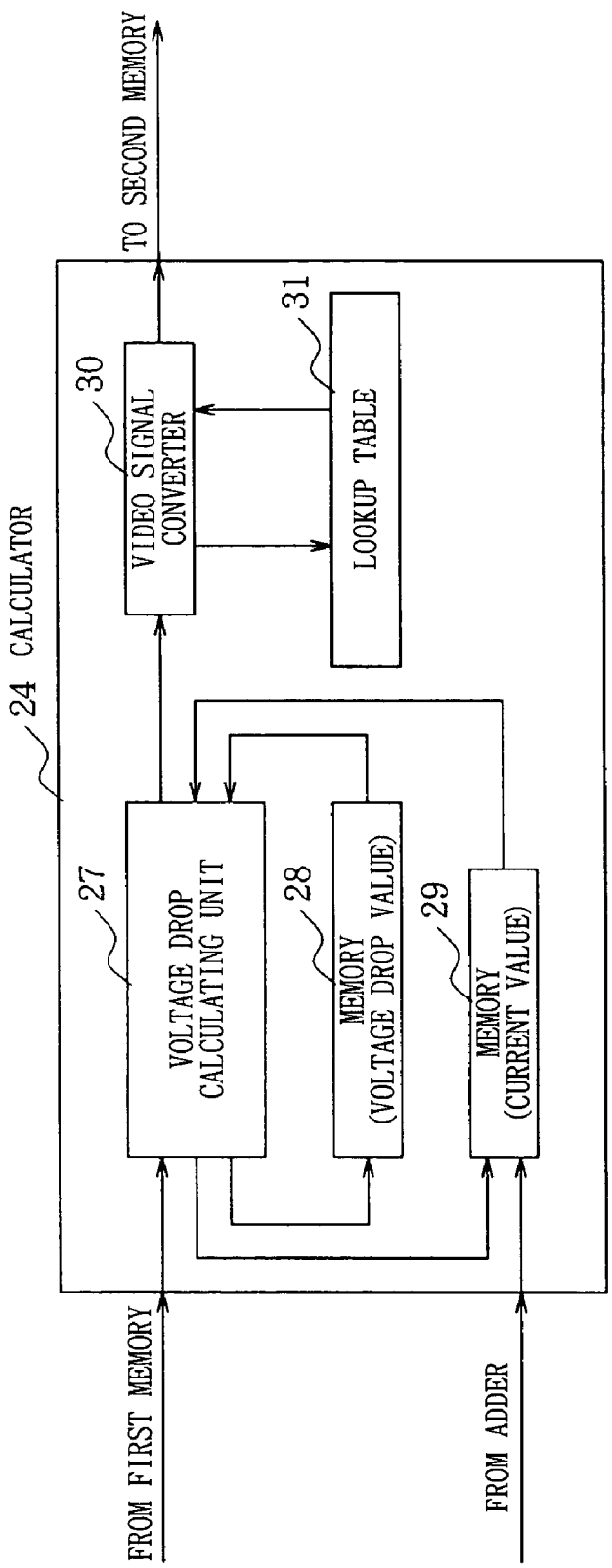
FIG. 2 is a block diagram showing the construction of a calculator.

Accordingly, the specific arrangement shown in FIG. 2 is used as the calculator 24 shown in FIG. 1. With reference to FIG. 2, the data to be input from the first memory 22 is fed to a voltage drop calculating unit 27, and the data to be input from the adder 23 is stored in a fourth memory 29. The unit 27 calculates the voltage drop value and the current value at the contemplated point for which the calculations are to be made, based on the voltage drop value and the current value at the point immediately preceding the contemplated point. The calculated voltage drop value and the current value are stored in a third memory 28 and the fourth memory 29, respectively.

The voltage drop calculating unit 27 first calculates the voltage drop value $\Delta V1$ and current value at point 1 based on the data (current value I) stored in the fourth memory 29, and feeds the results to the third memory 28 and the fourth memory 29, respectively. Subsequently, based on the voltage drop value ΔV1 at point 1 stored in the third memory 28 and the current value at point 1 stored in the fourth memory 29, the unit 27 calculates the voltage drop value ΔV2 and current value at point 2, and supplies the results to the third memory 28 and the fourth memory 29, respectively. In this way, the voltage drop values and the current values at the respective points are successively calculated, with the result that the voltage drop values at all points are obtained.

The voltage drop values obtained at the respective points by the voltage drop calculating unit 27 are fed to a video signal converter 30, which has connected thereto a lookup table 31. By reference to the lookup table 31, the video signal converter 30 converts the voltage drop value from the calculating unit 27 to a signal. Defined in the lookup table 31 are the source-drain voltage-current relationship and the relationship between the base voltage and the source-drain current, as determined for each second transistor TR2.

By reference to the lookup table 31, the video signal converter 30 converts the voltage drop value at each point to a current reduction of the second transistor TR2 and further to an increase in base voltage required to compensate for the current reduction, adds the result to the initial input data obtained from the first memory for the correction of the data, and output the corrected data to the second memory 25. In the case where the relationship involved in the conversion by the video signal converter 30 is a linear relationship or can be expressed by a functional equation, the signal conversion with use of the lookup table 31 can be replaced by processing for the multiplication of a constant or calculation with use of the functional equation.

Furthermore, the power source circuit 3 of FIG. 1 involves output resistance, which gives rise to the same phenomenon as the voltage drop due to the wiring resistance of the drive line described. Accordingly, such a voltage drop can be corrected by the same method as the voltage drop as a result of the wiring resistance of the drive line.

In the case of the organic EL display device of the present invention described, the input signal to each pixel is corrected in accordance with the voltage drop occurring in the drive line and the voltage drop occurring in the power source circuit 3. The pixel can therefore be caused to luminesce with luminance corresponding to the input signal despite the voltage drop, and is rendered free of the crosstalk that would otherwise result from the voltage drop. Further because the drive line 4 is disposed along the horizontal scanning lines, the correction processing described can be effected for every horizontal scanning line. This ensures facilitated calculation processing.

The device of the present invention is not limited to the foregoing embodiment in construction but can be modified variously without departing from the technical scope defined in the appended claims. For example, the present invention can be embodied not only into organic EL displays of the active matrix driving type but also into organic EL displays of the passive matrix driving type or inorganic EL displays of the passive matrix driving type.

The invention claimed is:

1. A flat display device wherein a pair of electrodes are arranged respectively on opposite sides of a luminescent layer, and a voltage in accordance with an input signal is applied across the electrodes by a drive signal supplied through a drive line for each of pixels provided by the luminescent layer to cause the luminescent layer to luminesce, wherein the display device comprises:

means provided for the drive line for calculating a voltage drop occurring in the drive line based on the magnitude of current flowing through the pixel in accordance with the input signal to be supplied to the pixel and on a resistance value depending on the position of the pixel, and means for correcting the input signal to be supplied to the pixel based on the magnitude of the calculated voltage drop.

2. A flat display device according to claim 1, wherein the luminescent layer comprises an organic material.

3. A flat display device according to claim 1, wherein the luminescent layer comprises an inorganic material.

4. A flat display device according to claim 1, which is of the active matrix driving type, and wherein the cathode is in the form of a sheet, and the anode is in the form of stripes.

5. A flat display device according to claim 1, which is of the passive matrix driving type, and wherein one of the electrodes is in the form of stripes extending horizontally, and the other electrode is in the form of stripes extending vertically.

6. A flat display device according to claim 1, wherein the drive lines are in the form of stripes extending in the same direction as the direction of scanning of display images.

7. A flat display device according to claim 1, wherein the voltage drop calculating means has a coefficient depending on the material characteristics of each of RGB pixels and calculates the magnitude of current flowing through the pixel in accordance with the coefficient and the input signal to the pixel.

8. A flat display device according to claim 1, wherein the input signal correcting means comprises first conversion means for converting the magnitude of the calculated voltage drop to a reduction in the current flowing through the pixel, and second conversion means for converting the current reduction obtained from the first conversion means to an amount of correction of the input signal to be supplied to the pixel.

* * * * *